United States Patent
Kurihara et al.

(10) Patent No.: US 6,794,665 B2
(45) Date of Patent: Sep. 21, 2004

(54) ELECTRON BEAM DRAWING APPARATUS

(75) Inventors: Masaki Kurihara, Tsuchiura (JP);
Toshihiko Horiuchi, Ushiku (JP);
Yoshimasa Fukushima, Hitachinaka (JP); Masaki Mizuochi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/356,505

(22) Filed: Feb. 3, 2003

(65) Prior Publication Data

US 2003/0197134 A1 Oct. 23, 2003

(30) Foreign Application Priority Data

Apr. 22, 2002 (JP) ........................ 2002-118659

(51) Int. Cl.[7] .................. H01J 37/20; H01J 37/304
(52) U.S. Cl. ................. 250/492.22; 250/492.2; 250/492.3; 250/491.1; 250/440.11; 250/442.11
(58) Field of Search ................. 250/492.2, 492.22, 250/492.3, 491.1, 440.11, 442.11

(56) References Cited

U.S. PATENT DOCUMENTS 6,538,719 B1 * 3/2003 Takahashi et al. ............ 355/53
6,587,581 B1 * 7/2003 Matsuyama et al. ........ 382/149

FOREIGN PATENT DOCUMENTS

| JP | 08-320570 | 12/1996 |
| JP | P2000-138279 A | 5/2000 |

* cited by examiner

Primary Examiner—Nikita Wells
(74) Attorney, Agent, or Firm—McDermott Will & Emery LLP

(57) ABSTRACT

An electron beam drawing apparatus has a sample chamber having a bottom plate, a side wall, and a top plate. Pillar members are disposed at four corners of the sample chamber and a frame is fixed to the pillar members. A plurality of supporting apparatuses for positioning a column mounted on the top plate to the frame are arranged around the column, thereby suppressing vibration of the column at the time of movement of a stage.

15 Claims, 2 Drawing Sheets

ELECTRON BEAM DRAWING APPARATUS

BACKGROUND OF THE INVENTION

The invention relates to an electron beam drawing apparatus for exposing a fine pattern onto a semiconductor or a mask mother disk.

An example of conventional electron beam drawing apparatuses has been disclosed in JP-A-8-320570. According to the above Official Gazette, an upper edge of an objective lens of an electron beam column is fixed to a sample chamber by beams in order to prevent the electron beam column from causing a rolling due to external vibration or vibration in the apparatus, particularly, movement of a sample stage. Thus, a lower edge of the objective lens is fixed to the sample chamber and the rolling is prevented by 2-point supporting.

Another example of the conventional electron beam drawing apparatuses has been disclosed in JP-A-2000-138279. According to the above Official Gazette, in order to miniaturize a stage and realize a lightweight thereof, the apparatus has a structure such that a flange portion of a projection optical system is provided for a column fixed base plate, leg portions of a frame are fixed to the column fixed base plate, and a reticle base is attached to the frame. Further, a pole portion is on a vibration isolating base which supports corner portions of the column base plate. The pole portion is projected to a drawing area from the column base plate and a hole for exposure is formed in a mid position of the pole portion.

According to the electron beam drawing apparatus disclosed in JP-A-8-320570, a technique such that even if out-of-plane rigidity of a top plate is not increased, by supporting two points of the lower edge and the upper edge of the objective lens of the column to the sample chamber, rotational vibration of the column can be reduced has been disclosed. However, by experimental studies by the present inventors et al., it has been found that in a rotational vibrating mode which is caused in the column by the movement of the stage, an out-of-plane deformation of the top plate is a main factor. Therefore, unless the out-of-plane deformation of the top plate is restricted, it is difficult to reduce the rotational vibration of the column.

If the out-of-plane deformation of the top plate is restricted and two points of the lower edge and the upper edge of the column are supported, the rotational vibration of the column which is caused at the time of the movement of the stage can be reduced. However, the sample chamber is also increased in size in association with an enlargement of the stage. With respect to the large top plate, it is difficult to increase the out-of-plane rigidity. That is, according to the above Official Gazette, the out-of-plane deformation of the top plate is not sufficiently considered.

The electron beam drawing apparatus is operated by setting the inside of the sample chamber into a vacuum state. At this time, a large load acts on the top plate of the sample chamber by a negative pressure (hereinafter, referred to as a vacuum negative pressure) between the atmospheric pressure and the vacuum pressure in the sample chamber. Since the load which is caused by the vacuum negative pressure increases in proportion to a size of top plate, if the out-of-plane rigidity of the top plate of the sample chamber is insufficient, the top plate sinks in the vertical direction and a large deformation is caused at the center of the top plate provided with the column.

According to JP-A-2000-138279, although the projection optical system has been provided on the column fixed base plate, in an exposing apparatus disclosed in this Official Gazette, since the projection optical system is not supported at two points, the foregoing problem occurs when the column fixed base plate enlarges. Nothing is considered with respect to such a problem.

Further, when the stage is accelerated or decelerated and moved in the electron beam drawing apparatus, an inertial force is generated and its reactive force is propagated to the sample chamber. Thus, the column standing upright on the top plate of the sample chamber is vibrated from a foundation. If the out-of-plane rigidity of the top plate supporting the column is small, a natural frequency of the column also decreases. When the natural frequency of the column decreases to a frequency component of the reactive force of the stage, the column is vibrated by the stage reactive force. By the studies of the present inventors et al., it has been found that the vibrating mode of the column in this case is a rotational vibrating mode in which the column is a rigid body and the top plate supporting the column is deformed.

When the rotational vibrating mode occurs, relative displacement in the horizontal direction is caused between the column and a sample, a positional deviation of an electron beam is caused on the sample, and positioning precision of the electron beam deteriorates. To avoid such a problem, if a high rigidity structure in which the column is provided on the top plate of the sample chamber and the rigidity in the out-of-plane direction of the top plate is raised is used, a weight of top plate increases and the maintenance performance of the stage deteriorates.

BRIEF SUMMARY OF THE INVENTION

The invention is made in consideration of the problems of the foregoing conventional techniques and it is an object of the invention to improve the reliability of drawing even in an electron beam drawing apparatus having a large sample chamber. Another object of the invention is to prevent a rotational vibration of a column even if a stage is moved in an electron beam drawing apparatus. Still another object of the invention is to improve a throughput in an electron beam drawing apparatus. Further another object of the invention is that the occurrence of a distortion in an electron lens provided in a column is prevented by restricting displacement in the vertical direction of the column. Further another object of the invention is to accomplish at least one of those objects.

According to the first aspect of the invention to accomplish the above objects, there is provided an electron beam drawing apparatus having a sample chamber in which a stage to set a sample has been enclosed, a fixed base plate for holding the sample chamber, and a column having therein an electron gun for irradiating an electron beam to the sample, comprising: a frame which sets the column onto a top plate in an upper portion of the sample chamber and has leg portions extending from corner portions of the fixed base plate to a center; a supporting apparatus held on the frame; and positioning means for adjusting a gap between the column and the supporting apparatus.

In the first aspect, vibration sensors are attached to side surfaces of an upper portion and a lower portion of the column, the positioning means has an actuator, and control means for controlling the actuator on the basis of signals detected by the vibration sensors can be also provided. There are four leg portions of the frame, the supporting apparatus can be arranged at positions where an outer circumference of the column is divided into almost four equal parts, and the control apparatus can synchronously control the actuators arranged symmetrically with respect to an axis of the column. Further, it is desirable that the control means controls in a manner such that when one of the actuators arranged symmetrically is executing the tensile operation, the other actuator executes the contracting operation.

According to the second aspect of the invention to accomplish the above objects, there is provided an electron beam drawing apparatus having a stage on which a sample is set and which is moved in the horizontal direction, a sample chamber for enclosing the stage, a fixed base plate for mounting the sample chamber, and a column which is arranged in an upper portion of the sample chamber and has therein an electron gun, an electron lens for shaping and converging an electron beam emitted from the electron gun, and a deflector for deflecting the electron beam, comprising: pillar members provided for the fixed base plate; a frame which is fixed to the pillar members and arranged around the column; and a plurality of supporting apparatuses which are fixed to the frame and support the column.

In the second aspect, the pillar members can be integrated with the sample chamber, both ends of the supporting apparatuses are coupled with the column and the frame, respectively, and each of the supporting apparatuses can include a coupling member which is rigid in the rectilinear direction coupling the column and the frame and is soft in at least one of the directions which cross perpendicularly the rectilinear direction. The supporting apparatus includes a direct acting actuator for applying a dynamic load in the horizontal direction of the column, and the electron beam drawing apparatus can have: vibration sensors which are arranged in an upper portion and a lower portion of the column and measure acceleration; and a controller for controlling the direct acting actuator so as to reduce a relative amount of the acceleration of the vibration sensor.

According to the invention having such aspects, since the frame for mounting the supporting apparatuses is fixed to the pillar members having high rigidity, the frame can support the column in its upper portion in the horizontal direction without being influenced by the out-of-plane deformation of the top plate due to the vacuum negative pressure. Thus, a natural frequency of the column can be increased merely by supporting the column at two points of the lower portion and the upper portion of the column, and the rotational vibration of the column can be reduced against the movement reactive force of the stage. Since the direct acting actuator is controlled so as to reduce the relative amount of the acceleration by using the acceleration vibration sensors arranged in the upper portion and the lower portion of the column, the rotational vibration of the column can be further suppressed.

Since the coupling member which is rigid in the axial direction and soft in the shearing direction is provided, the rotational vibration of the column is reduced. Moreover, since a situation such that the top plate sinks due to the vacuum negative pressure and the vertical direction of the column is deviated or a situation such that the electron lens generates heat and the column is extended in the vertical direction is not restricted, shaping performance and convergence of the electron beam are improved and a drift of the electron beam can be prevented.

Other objects, features and advantages of the invention will become apparent from the following description of the embodiments of the invention taken in conjunction with the accompanying drawings.

DETAILED DESCRIPTION OF THE INVENTION

Figure 1:
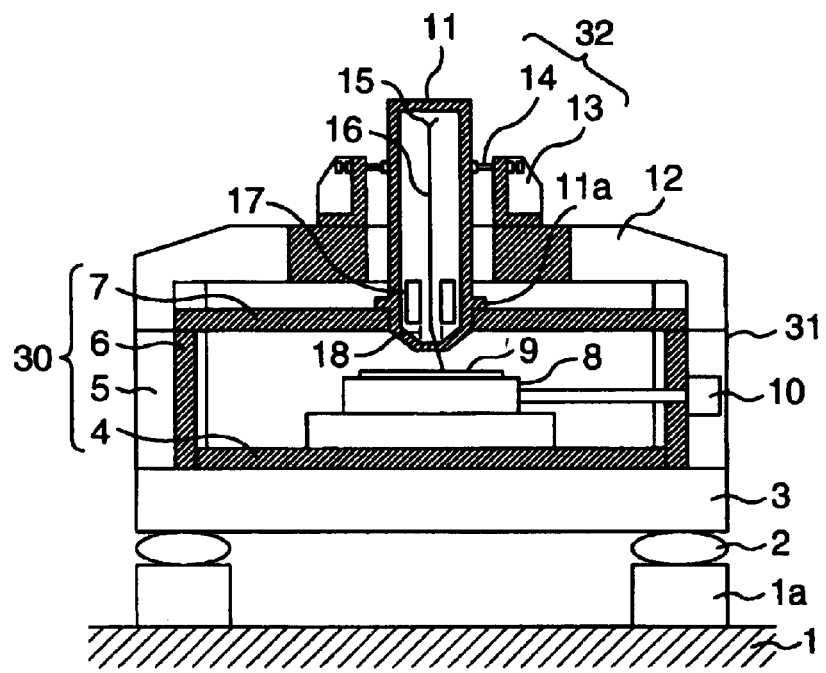
FIG. 1 is a vertical sectional view of an embodiment of an electron beam drawing apparatus according to the invention.
Figure 2:
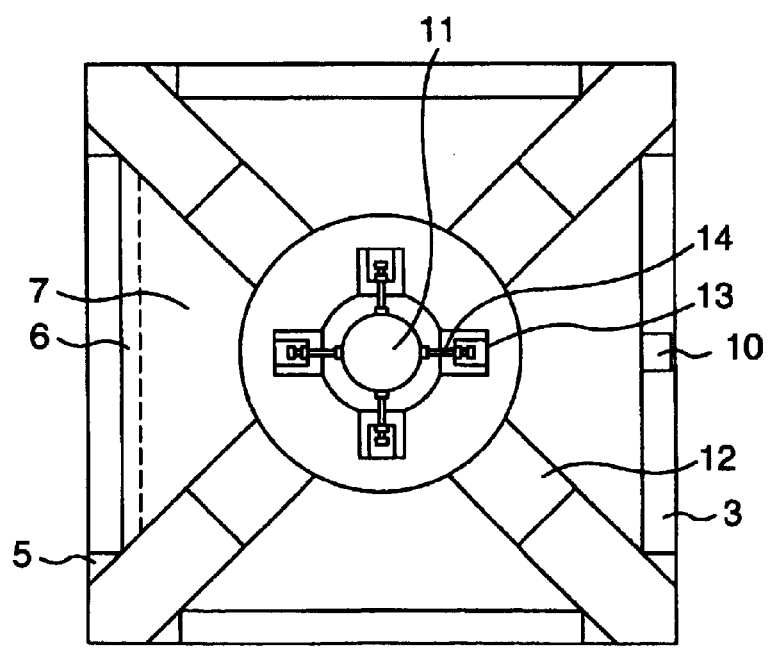
FIG. 2 is a plan view of FIG. 1.

Several embodiments of the invention will be described hereinbelow with reference to the drawings. FIG. 1 is a vertical sectional view of an embodiment of an electron beam drawing apparatus according to the invention and FIG. 2 is a plan view of the electron beam drawing apparatus shown in FIG. 1. An electron beam drawing apparatus 31 comprises: a fixed base plate 3 which is supported by vibration isolating mounts 2 held by holding members 1a on a floor 1; a sample chamber 30 put on the fixed base plate 3; a stage 8 enclosed in the sample chamber 30; and a column 11 arranged at the center of a top plate 7 which forms an upper portion of the sample chamber 30.

A flange 11a is formed in a lower portion of the column 11. The sample chamber 30 is formed in a rectangular parallelepiped shape by a bottom plate 4, a side wall 6, and the top plate 7. Pillar members 5 are positioned in four corner portions. The flange 11a of the column 11 is fixed to the top plate 7 by bolts. The inside of the sample chamber 30 and the inside of the column 11 are held in a vacuum state. An electron gun 15 is attached in a top portion in the column 11. An electron lens 17 and a deflector 18 are arranged in a lower portion in the column 11, respectively.

As shown in FIG. 2, a frame 12 having four legs is fixed to each of the pillar members 5 provided at four corners of the sample chamber 30. A center portion of the frame 12 has a circular shape and the frame is radially extended from this circular portion to the pillar members 5. A plurality of stand members 13 are fixed onto the frame 12. The stand members 13 are arranged at positions where an outer circumference of the column 11 which pierces the center portion of the frame 12 is divided into almost equal parts, respectively.

The stand member 13 has an L-character shaped cross section. A positioning member 14 for setting a distance between the upper portion of the column 11 and the stand member 13 to a predetermined value is attached to an upper portion of the stand member. A screw is formed in a side edge portion of the positioning member 14 on the column 11 side. This screw is coupled into a screw hole formed in the column 11. In place of such a screw structure, a front edge of the positioning member 14 can be also pressed to the column 11, or it is also possible to construct in a manner such that the positioning member 14 is fixed to the column 11 and the positioning member 14 is pulled, thereby pulling the column 11 toward the stand member 13 side.

If there is a fear that the top plate 7 sinks due to the vacuum negative pressure or the column 11 is thermally deformed and the positioning precision of the column 11 is deteriorated, a rod member, a wire, or laminate rubber which is rigid in the axial direction of the positioning member 14 and soft in the shearing direction, that is, in the vertical direction of the column 11 is used as a positioning member 14. In the case of using the laminate rubber, since rubbers and iron plates each having a thin plate thickness are alternately laminated, rigidity in the compressing direction of the laminate rubber can be set to a value which is 1000 times or more as large as that in the shearing direction. The laminate rubber is arranged so that the compressing direction of the rubber plate is set to the horizontal direction. A silicon system having excellent high temperature characteristics is used as a rubber material of the laminate rubber. It is also possible to construct in a manner such that an edge portion of the positioning member 14 on the column side is slidable in the vertical direction.

The operation of the electron beam drawing apparatus 31 constructed as mentioned above will be described hereinbelow. An electron beam 16 emitted from the electron gun 15 is converged by the electron lens 17. It is deflected by the deflector 18 and irradiated onto a sample 9 put on the stage 8 enclosed in the sample chamber 30. A stage driving system 10 having a rod which pierces the sample chamber 30 is provided in order to drive the stage 8. When a fine pattern is drawn onto the surface of the sample 9 by the electron beam 16, the stage 8 is continuously moved by using the stage driving system 10. At this time, the stage 8 moves the sample 9 to the irradiating position of the electron beam. Since the positioning precision of the electron beam 16 and the stage 8 is equal to tens of nm, the movement of the stage 8 is easily influenced by vibration of the floor. To prevent such influence, the floor vibration is isolated by the vibration isolating mounts 2 arranged under the main body of the electron beam drawing apparatus 31.

When the stage 8 is moved in the horizontal direction, particularly, when the stage 8 is moved while being accelerated and decelerated, a reactive force of an inertial force of the stage 8 becomes a vibrating force and vibrates the sample chamber 30. Thus, the column 11 put on the top plate 7 of the sample chamber 30 is rotationally vibrated by an out-of-plane deformation of the top plate 7.

In the conventional electron beam drawing apparatus, since a lower edge of the column 11 is cantilevered, there is a problem such that the upper portion of the column 11 where the electron gun 15 is provided vibrates more, and the upper portion of the column 11 vibrates almost in the horizontal direction. In the embodiment, since the upper portion of the column 11 is restricted from the circumference in the horizontal direction, two points of the lower portion and the upper portion of the column 11 are supported, thereby increasing the supporting rigidity in the horizontal direction of the column 11. Therefore, since the natural frequency of the column 11 can be set to be enough higher than a frequency component of the reactive force which is generated when the stage 8 is moved, an amplitude of displacement of the column 11 can be reduced. If an attenuating member is provided in parallel with the positioning member 14, the displacement amplitude of the column 11 can be further reduced.

Figure 3:
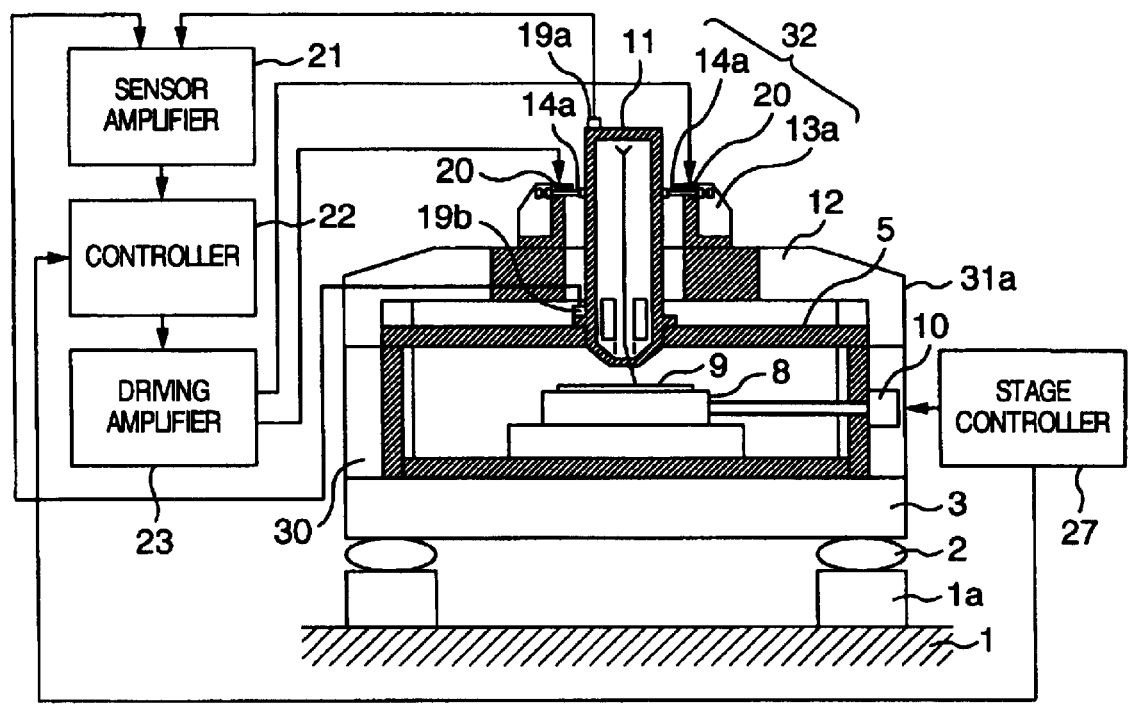
FIG. 3 is a vertical sectional view of another embodiment of an electron beam drawing apparatus according to the invention.
Figure 4:
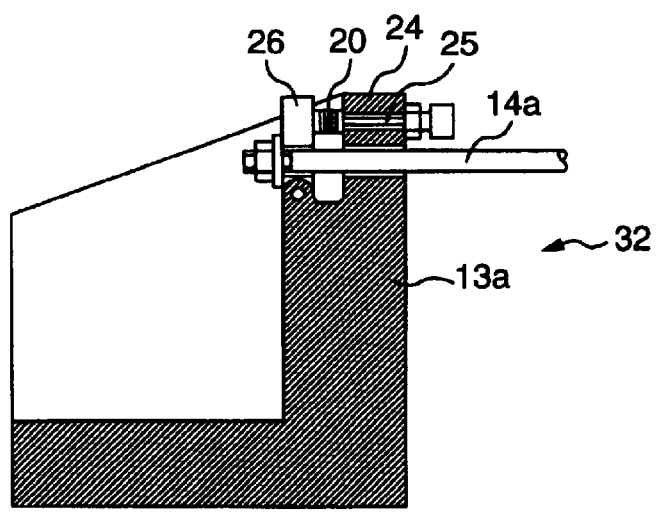
FIG. 4 is a detailed vertical sectional view of a direct acting actuator portion in FIG. 3.

FIG. 3 shows another embodiment (31a) of an electron beam drawing apparatus. Although the vibration of the column 11 is passively controlled in the embodiment shown in FIG. 1, the vibration of the column 11 is actively controlled in another embodiment. FIG. 4 shows a vertical sectional view of each supporting apparatus 32 of the column 11, in which the supporting apparatuses are used to actively control the vibration of the column 11.

As shown in FIG. 4, each of the supporting apparatuses 32 comprises: a stand member 13a having an L-character shaped cross section; a lever portion 26 rotatably attached to an upper portion of the stand member 13a; and a rod 14a whose one end portion is fixed to the lever portion by a nut. By pulling the upper portion of the column 11 with the rod 14a, positioning and an inclination to the sample chamber 30 of the column 11 are controlled. In order to make the lever 26 rotatable, the upper portion of the stand member 13a becomes a fixing portion 24 which forms a space between this upper portion and the lever portion 26. Therefore, the lever portion 26 and the fixing portion 24 have a U-character shape.

A direct acting actuator 20 in which one end is come into contact with an inner wall surface of the lever portion 26 and the other end is come into contact with a pressing member 25 inserted into a hole formed so as to pierce the fixing portion 24 is arranged in the U-character shaped portion. The pressing member 25 is fixed to the fixing portion 24, that is, the stand member 13a. The direct acting actuator 20 is held by the pressing member 25 without a gap. To control the direct acting actuator 20, vibration sensors 19a and 19b for measuring acceleration in the horizontal direction are attached to the upper surface of the column 11 and in a position near the flange 11a, respectively.

A control system for controlling the vibration of the column 11 by using the vibration sensors 19a and 19b and the direct acting actuator 20 will now be described. Vibration signals detected by the vibration sensors 19a and 19b are inputted to a sensor amplifier 21. They are amplified by the sensor amplifier 21 and inputted to a controller 22. The controller 22 forms a control signal so as to decrease the relative amount of the vibration displacement and sends a control instruction to the direct acting actuator 20 via a driving amplifier 23. The displacement of the column 11 is controlled by feeding back the detection signals of the vibration sensors 19a and 19b as mentioned above.

When the vibration of the column 11 is suppressed, the relative displacement of the electron gun 15 and the sample 9 is remarkably reduced. Particularly, in the embodiment shown in FIG. 3, since the supporting apparatuses 32 each having the rod 14a, stand member 13a, and direct acting actuator 20 are symmetrically provided with respect to the axis of the column 11, when the direct acting actuator 20 of one of the supporting apparatuses 32 is driven so as to be extended, the direct acting actuator 20 of the other supporting apparatus 32 arranged at the symmetrical opposite position is driven so as to be contracted synchronously with the one extended direct acting actuator 20.

That is, in the one actuator 20, the lever 26 pin-coupled with the stand member 13a is pressed outwardly. In association with the outward rotation of the lever 26, the rod 14a is also pulled outwardly and the front edge of the rod 14a acts tension on the fixed column 11. At this time, since the direct acting actuator 20 arranged at the symmetrical opposite position executes the contracting operation, the rod 14a is moved inwardly by a similar operation, thereby reducing the tension acting on the column 11. As mentioned above, if the two direct acting actuators 20 arranged symmetrically are operated so that the displacement direction is opposite to the direction of the vibration of the column 11, the vibration of the column 11 at the time of movement of the stage 8 can be suppressed.

It is also possible to construct in a manner such that a stage controller 27 for controlling the stage 8 on which the sample 9 is put is provided, a control signal formed by the controller 27 is inputted to both of the stage driving system 10 and the controller 22 for the direct acting actuators 20, and the direct acting actuators 20 are feed-forward controlled. Even if the feed-forward control is used as mentioned above, the vibration of the column 11 can be suppressed.

Although the pillar members have been integrated with the sample chamber and used as component members of the sample chamber in each of the foregoing embodiments, it is not always necessary to use the pillar members as component members. If the pillar members are used as component members of the sample chamber, the electron beam drawing apparatus can be miniaturized. Further, the foregoing embodiments are shown as embodiments of the invention and the invention is not limited to those embodiments. All modifications within the spirit and scope of the present invention are incorporated in the scope of claims.

According to the invention as mentioned above, since the position of the column of the electron beam drawing apparatus is passively or actively controlled, the vibration of the column which is caused when the stage of the electron beam drawing apparatus is moved can be remarkably reduced. Thus, a deviation in the drawing using the electron beam can be avoided.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. An electron beam drawing apparatus having a sample chamber in which a stage to set a sample has been enclosed, a fixed base plate for holding said sample chamber, and a column having therein an electron gun for irradiating an electron beam to said sample, comprising:

a frame which sets said column onto a top plate in an upper portion of said sample chamber and has leg portions extending from corner portions of said fixed base plate to a center;

a supporting apparatus held on said frame; and positioning means provided within said supporting apparatus for adjusting a gap between said column and said supporting apparatus.

2. An apparatus according to claim 1, wherein vibration sensors are attached to an upper portion and a side surface of a lower portion of said column, said positioning means has an actuator, and said apparatus further has control means for controlling said actuator on the basis of signals detected by said vibration sensors.

3. An apparatus according to claim 1, wherein there are four leg portions of said frame and said supporting means are arranged at positions where an outer circumference of said column is divided into almost four equal parts.

4. An apparatus according to claim 2, wherein said supporting means are arranged at positions where an outer circumference of said column is divided into almost four equal parts, and said control means synchronously controls the actuators symmetrically arranged with respect to an axis of said column.

5. An apparatus according to claim 4, wherein said control means controls said actuators in a manner such that when one of the symmetrically arranged actuators executes a tensile operation, the other actuator executes a contracting operation.

6. An electron beam drawing apparatus having a stage on which a sample is set and which is moved in the horizontal direction, a sample chamber for enclosing said stage, a fixed base plate for mounting said sample chamber, and a column which is arranged in an upper portion of said sample chamber and has therein an electron gun, an electron lens for shaping and converging an electron beam emitted from said electron gun, and a deflector for deflecting the electron beam, comprising:

pillar members provided for said fixed base plate;

a frame which is fixed to said pillar members and arranged around said column; and a plurality of supporting apparatuses which are fixed to said frame and support said column.

7. An apparatus according to claim 6, wherein said pillar members are integrated with said sample chamber.

8. An apparatus according to claim 6, wherein said supporting apparatus includes a coupling member whose both edges are coupled with said column and said frame, respectively, and which is rigid in the rectilinear direction coupling said column and said frame and soft in at least one of the directions which cross perpendicularly said rectilinear direction.

9. An apparatus according to claim 7, wherein said supporting apparatus includes a coupling member whose both edges are coupled with said column and said frame, respectively, and which is rigid in the rectilinear direction coupling said column and said frame and soft in at least one of the directions which cross perpendicularly said rectilinear direction.

10. An apparatus according to claim 6, wherein said supporting apparatus includes a direct acting actuator for applying a dynamic load in the horizontal direction of said column, and said electron beam drawing apparatus further has: vibration sensors which are arranged in an upper portion and a lower portion of said column and measure acceleration; and a controller for controlling said direct acting actuator so as to reduce relative amounts of the acceleration of said vibration sensors.

11. An apparatus according to claim 7, wherein said supporting apparatus includes a direct acting actuator for applying a dynamic load in the horizontal direction of said column, and said electron beam drawing apparatus further has: vibration sensors which are arranged in an upper portion and a lower portion of said column and measure acceleration; and a controller for controlling said direct acting actuator so as to reduce relative amounts of the acceleration of said vibration sensors.

12. An apparatus according to claim 10, wherein said supporting apparatus has a stand member, a rod for positioning said column to said stand member, and a direct acting actuator for driving said rod, and said stand member has a fixing portion and a lever pin-coupled with said fixing portion, and when said actuator is driven, said lever is rotated, thereby reciprocating said rod.

13. An apparatus according to claim 11, wherein said supporting apparatus has a stand member, a rod for positioning said column to said stand member, and a direct acting actuator for driving said rod, and said stand member has a fixing portion and a lever pin-coupled with said fixing portion, and when said actuator is driven, said lever is rotated, thereby reciprocating said rod.

14. An electron beam drawing apparatus comprising:

a sample chamber in which a stage to set a sample has been enclosed;

a fixed base plate for holding said sample chamber;

a column comprising an electron gun for irradiating an electron beam to said sample;

a frame which sets said column onto a top plate in an upper portion of said sample chamber and has leg portions extending from corner portions of said fixed base plate to a center;

a supporting apparatus held on said frame; and positioning means provided within said supporting apparatus for adjusting a gap between said column and said supporting apparatus.

15. An electron beam drawing apparatus comprising:
- a stage on which a sample is set and which is moved in the horizontal direction;
- a sample chamber for enclosing said stage;
- a fixed base plate for mounting said sample chamber;
- a column which is arranged in an upper portion of said sample chamber and comprises therein an electron gun, an electron lens for shaping and converging an electron beam emitted from said electron gun, and a deflector for deflecting the electron beam;
- a pillar members provided for said fixed base plate;
- a frame which is fixed to said pillar members and arranged around said column; and
- a plurality of supporting apparatuses which are fixed to said frame and support said column.

* * * * *